(12) United States Patent
Han et al.

(10) Patent No.: US 11,362,130 B2
(45) Date of Patent: Jun. 14, 2022

(54) BACKSIDE ILLUMINATED IMAGE SENSOR AND METHOD OF MANUFACTURING THE SAME

(71) Applicant: DB HITEK CO., LTD., Seoul (KR)

(72) Inventors: Chang Hun Han, Icheon-si (KR); Jong Man Kim, Seongnam-si (KR)

(73) Assignee: DB HITEK CO., LTD., Seoul (KR)

( * ) Notice: Subject to any disclaimer, the term of this patent is extended or adjusted under 35 U.S.C. 154(b) by 165 days.

(21) Appl. No.: 16/748,347

(22) Filed: Jan. 21, 2020

(65) Prior Publication Data

US 2020/0235145 A1 Jul. 23, 2020

(30) Foreign Application Priority Data

Jan. 22, 2019 (KR) .................. 10-2019-0008296

(51) Int. Cl.
*H01L 27/146* (2006.01)

(52) U.S. Cl.
CPC .... *H01L 27/1464* (2013.01); *H01L 27/14621* (2013.01); *H01L 27/14627* (2013.01); *H01L 27/14603* (2013.01)

(58) Field of Classification Search
None
See application file for complete search history.

(56) References Cited

U.S. PATENT DOCUMENTS

| 10,217,787 | B2 | 2/2019 | Han | |
| 10,950,649 | B2* | 3/2021 | Han | H01L 27/14621 |
| 2012/0205769 | A1* | 8/2012 | Tsai | H01L 27/14632 |
| | | | | 438/66 |
| 2013/0037958 | A1* | 2/2013 | Ho | H01L 24/05 |
| | | | | 257/E23.079 |
| 2015/0340400 | A1* | 11/2015 | Takemoto | H01L 27/14636 |
| | | | | 257/448 |
| 2017/0186802 | A1* | 6/2017 | Huang | H01L 27/14689 |
| 2020/0235144 | A1* | 7/2020 | Han | H01L 27/14623 |

* cited by examiner

*Primary Examiner* — Ali Naraghi
(74) *Attorney, Agent, or Firm* — Patterson Thuente Pedersen, P.A.

(57) ABSTRACT

A backside illuminated image sensor includes a substrate having a frontside surface, a backside surface and a recess formed in a backside surface portion thereof, pixel regions disposed in the substrate, an insulating layer disposed on the frontside surface of the substrate, a bonding pad disposed on a frontside surface of the insulating layer, and a second bonding pad disposed in the recess and electrically connected with the bonding pad.

6 Claims, 15 Drawing Sheets

BACKSIDE ILLUMINATED IMAGE SENSOR AND METHOD OF MANUFACTURING THE SAME

CROSS-REFERENCE TO RELATED APPLICATION

This application claims the priority benefit of Korean Patent Application No. 10-2019-0008296, filed on Jan. 22, 2019, and all the benefits accruing therefrom under 35 U.S.C. § 119, the contents of which are incorporated by reference in their entirety.

TECHNICAL FIELD

The instant application relates generally to semiconductor device manufacturing and processes thereof. These processes result in novel devices for use in backside illuminated image sensors.

BACKGROUND

The present disclosure relates to a backside illuminated image sensor and a method of manufacturing the same.

In general, an image sensor is a semiconductor device that converts an optical image into electrical signals, and may be classified or categorized as a Charge Coupled Device (CCD) or a Complementary Metal Oxide Semiconductor (CMOS) Image Sensor (CIS).

The CIS includes unit pixels, each including a photodiode and MOS transistors. The CIS sequentially detects the electrical signals of the unit pixels using a switching method, thereby forming an image. The CIS may be classified as either a frontside illuminated image sensor or a backside illuminated image sensor.

The backside illuminated image sensor may include pixel regions in a substrate, transistors formed on a frontside surface of the substrate, an insulating layer formed on the transistors, bonding pads on the insulating layer, an anti-reflective layer formed on a backside surface of the substrate, a light-blocking pattern formed on the anti-reflective layer, a planarization layer formed on the light-blocking pattern, a color filter layer formed on the planarization layer, and micro lens array formed on the color filter layer.

The bonding pads may be exposed by openings formed through the anti-reflective layer, the substrate and the insulating layer. Further, second bonding pads may be formed on the anti-reflective layer, inner side surfaces of the openings and the bonding pads may be exposed by the openings, and third bonding pads may be formed on the second bonding pads. Wires may be bonded on the third bonding pads or solder bumps may be formed on the third bonding pads.

For example, after forming the openings, a first metal layer such as a tungsten layer may be formed, and a second metal layer such as an aluminum layer may be formed on the first metal layer. The third bonding pads may be formed by patterning the second metal layer, and the second bonding pads may be formed by patterning the first metal layer.

The light-blocking pattern may be simultaneously formed with the second bonding pads. For example, after forming the third bonding pads, a photoresist layer may be formed on the first metal layer and the third bonding pads, and a photoresist pattern may then be formed by a photolithography process. The second bonding pads and the light-blocking pattern may be formed by an anisotropic etching process using the photoresist pattern as an etching mask. In this case, a thickness of portions of the photoresist pattern formed on the third bonding pads may be relatively thin compared to portions of the photoresist pattern formed on the first metal layer, so that the third bonding pads may be partially removed during the anisotropic etching process.

The color filter layer may be formed by forming a color photoresist layer on the planarization layer and then patterning the color photoresist layer. The color photoresist layer may be formed by a spin coating process, and stripe defects may occur in the color photoresist layer by the second and third bonding pads during the spin coating process.

Further, after forming the openings, a protective layer may be formed on the backside surface of the substrate to protect the substrate. Particularly, the protective layer may be formed on the anti-reflective layer and inner side surfaces of the openings, and the substrate may be electrically isolated from the bonding pads by the protective layer. However, the distance between the pixel regions and the micro lens array may be increased by the protective layer, and the sensitivity and crosstalk of the backside illuminated image sensor may thus be deteriorated.

SUMMARY

The present disclosure provides a backside illuminated image sensor having an improved structure and a method of manufacturing the backside illuminated image sensor.

In accordance with an aspect of the present disclosure, a backside illuminated image sensor may include a substrate having a frontside surface, a backside surface and a recess formed in a backside surface portion thereof, pixel regions disposed in the substrate, an insulating layer disposed on the frontside surface of the substrate, a bonding pad disposed on a frontside surface of the insulating layer, and a second bonding pad disposed in the recess and electrically connected with the bonding pad.

In accordance with some embodiments of the present disclosure, the backside illuminated image sensor may further include an anti-reflective layer disposed on the backside surface of the substrate.

In accordance with some embodiments of the present disclosure, the anti-reflective layer may include a first portion disposed on an inner side surface of the recess and a second portion disposed on a bottom surface of the recess, and the second bonding pad may be disposed on the second portion of the anti-reflective layer.

In accordance with some embodiments of the present disclosure, the anti-reflective layer, the substrate and the insulating layer may have a first opening, a second opening and a third opening for exposing a portion of a backside surface of the bonding pad, respectively, and the second bonding pad may be electrically connected with the bonding pad through the first opening, the second opening and the third opening.

In accordance with some embodiments of the present disclosure, the backside illuminated image sensor may further include a first spacer disposed on inner side surfaces of the first, second and third openings.

In accordance with some embodiments of the present disclosure, the backside illuminated image sensor may further include a second spacer disposed on the first portion of the anti-reflective layer.

In accordance with some embodiments of the present disclosure, the backside illuminated image sensor may further include a third bonding pad disposed on the second bonding pad, and a sum of a thickness of the second bonding pad and a thickness of the third bonding pad may be smaller than a depth of the recess.

In accordance with some embodiments of the present disclosure, the backside illuminated image sensor may further include a light-blocking pattern disposed on the anti-reflective layer and having fourth openings corresponding to the pixel regions.

In accordance with some embodiments of the present disclosure, the second bonding pad may be made of the same material as the light-blocking pattern.

In accordance with some embodiments of the present disclosure, the anti-reflective layer may include a metal oxide layer disposed on the backside surface of the substrate, a silicon oxide layer disposed on the metal oxide layer; and a silicon nitride layer disposed on the silicon oxide layer.

In accordance with an aspect of the present disclosure, a method of manufacturing a backside illuminated image sensor may include forming pixel regions in a substrate, forming an insulating layer on a frontside surface of the substrate, forming a bonding pad on a frontside surface of the insulating layer, partially removing a backside surface portion of the substrate to form a recess, and forming a second bonding pad in the recess to be electrically connected with the bonding pad.

In accordance with some embodiments of the present disclosure, the method may further include forming an anti-reflective layer on a backside surface of the substrate.

In accordance with some embodiments of the present disclosure, the anti-reflective layer may include a first portion formed on an inner side surface of the recess and a second portion formed on a bottom surface of the recess, and the second bonding pad may be formed on the second portion of the anti-reflective layer.

In accordance with some embodiments of the present disclosure, the method may further include partially removing the anti-reflective layer, the substrate and the insulating layer to form a first opening, a second opening and a third opening which exposes a portion of a backside surface of the bonding pad.

In accordance with some embodiments of the present disclosure, the method may further include forming a first spacer on inner side surfaces of the first, second and third openings.

In accordance with some embodiments of the present disclosure, forming the second bonding pad may include forming a first metal layer on the anti-reflective layer, the first spacer and the portion of the backside surface of the bonding pad exposed by the first, second and third openings, and patterning the first metal layer to form the second bonding pad.

In accordance with some embodiments of the present disclosure, the method may further include forming a third bonding pad on the second bonding pad.

In accordance with some embodiments of the present disclosure, forming the third bonding pad may include forming a second metal layer on the first metal layer, and patterning the second metal layer to form the third bonding pad.

In accordance with some embodiments of the present disclosure, the method may further include forming a light-blocking pattern having fourth openings corresponding to the pixel regions on the anti-reflective layer, wherein the light-blocking pattern may be simultaneously formed with the second bonding pad.

In accordance with some embodiments of the present disclosure, a sum of a thickness of the second bonding pad and a thickness of the third bonding pad may be smaller than a depth of the recess.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
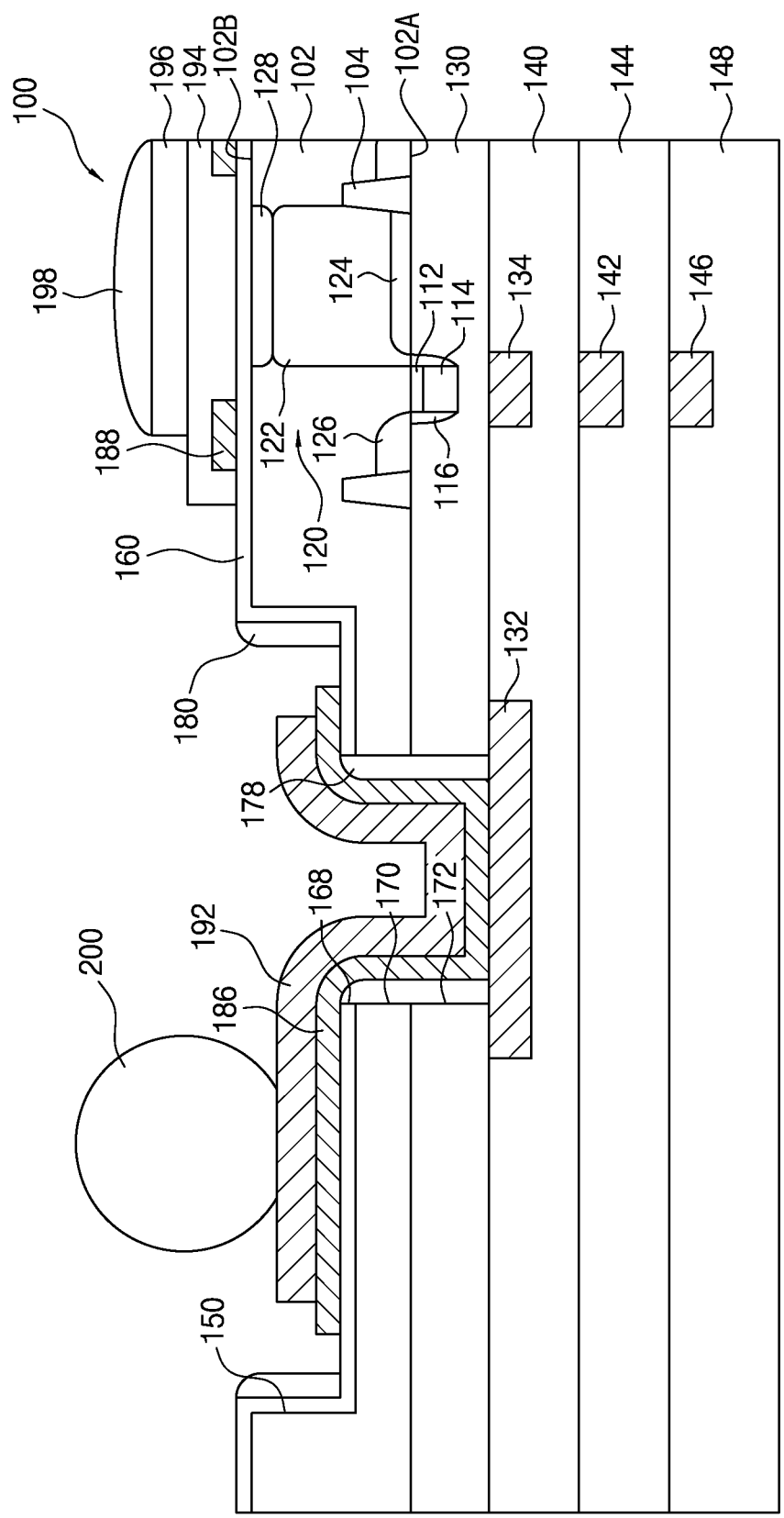
FIG. 1 is a cross-sectional view illustrating a backside illuminated image sensor in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the description of the present invention but rather are provided to convey one aspect of the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

FIG. 1 is a cross-sectional view illustrating a backside illuminated image sensor 100 in accordance with an embodiment of the present disclosure.

Referring to FIG. 1, a backside illuminated image sensor 100, in accordance with an embodiment of the present disclosure, may include a substrate 102 having a frontside surface 102A and a backside surface 102B, pixel regions 120 formed in the substrate 102, an insulating layer 130 formed on the frontside surface 102A of the substrate 102, a bonding pad 132 formed on a frontside surface of the insulating layer 130, and an anti-reflective layer 160 formed on the backside surface 102B of the substrate 102. Particularly, the backside illuminated image sensor 100 may include a recess 150 formed in a backside surface portion of the substrate 102 and a second bonding pad 186 formed in the recess 150 and electrically connected with the bonding pad 132. Further, the backside illuminated image sensor 100 may include a third bonding pad 192 formed on the second bonding pad 186, and the second and third bonding pads 186 and 192 may be disposed in the recess 150.

The anti-reflective layer 160 may extend along an inner side surface and a bottom surface of the recess 150. That is, the anti-reflective layer 160 may include a first portion 160A (refer to FIG. 9) formed on the inner side surface of the recess 150 and a second portion 160B (refer to FIG. 9) formed on the bottom surface of the recess 150. Further, the anti-reflective layer 160, the substrate 102 and the insulating layer 130 may have a first opening 168, a second opening 170 and a third opening 172 to expose a portion of a backside surface of the bonding pad 132, respectively. Specifically, the bonding pad 132 may be arranged to correspond with the recess 150, and the third opening 172 may be formed through the insulating layer 130 to expose the portion of the backside surface of the bonding pad 132. The second opening 170 may be formed through a bottom portion of the recess 150, and the first opening 168 may be formed through the second portion 160B of the anti-reflective layer 160.

The second bonding pad 186 may be conformally formed to have a uniform thickness on the second portion 160B of the anti-reflective layer 160, inner side surfaces of the first, second and third openings 168, 170 and 172, and the portion of the backside surface of the bonding pad 132. The third bonding pad 192 may be conformally formed to have a uniform thickness on the second bonding pad 186. Particularly, a sum of a thickness of the second bonding pad 186 and a thickness of the third bonding pad 192 may be smaller than a depth of the recess 150, and thus the third bonding pad 192 may be prevented from being protruded from the recess 150. For example, the second bonding pad 186 may be made of a metallic material, e.g., tungsten, and the third bonding pad 192 may be made of a metallic material, e.g., aluminum. Further, though not shown in FIG. 1, a titanium layer and a titanium nitride layer serving as a diffusion barrier layer and an adhesive layer may be formed between the bonding pad 132 and the second bonding pad 186.

A first spacer 178 may be formed on the inner side surfaces of the first, second and third openings 168, 170 and 172, and a second spacer 180 may be formed on the first portion 160A of the anti-reflective layer 160. Particularly, the substrate 102 may be electrically isolated from the second bonding pad 186 by the second portion 160B of the anti-reflective layer 160 and the first spacer 178. That is, the second bonding pad 186 may be disposed on the second portion 160B of the anti-reflective layer 160, the first spacer 178, and the portion of the backside surface of the bonding pad 132 exposed by the first, second and third openings 168, 170 and 172.

Further, the backside illuminated image sensor 100 may include a light-blocking pattern 188 disposed on the anti-reflective layer 160 and having fourth openings 190 (refer to FIG. 15) corresponding to the pixel regions 120. Particularly, the light-blocking pattern 188 may be made of the same material as the second bonding pad 186. For example, a tungsten layer may be formed on the anti-reflective layer 160, and an aluminum layer may be formed on the tungsten layer. The third bonding pad 192 may be formed by patterning the aluminum layer, and the second bonding pad 186 and the light-blocking pattern 188 may then be formed by patterning the tungsten layer.

A planarization layer 194 may be disposed on the anti-reflective layer 160 and the light-blocking pattern 188, and a color filter layer 196 and a micro lens array 198 may be disposed on the planarization layer 194. For example, the planarization layer 194 may be made of an insulating material such as silicon oxide or silicon nitride.

In accordance with the present embodiment, the second bonding pad 186 and the third bonding pad 192 may be disposed in the recess 150, and thus stripe defects may be prevented from occurring during a photoresist coating process for forming the color filter layer 196. Further, the third bonding pad 192 may be prevented from being partially removed during an etching process for forming the second bonding pad 186 and the light-blocking pattern 188.

Each of the pixel regions 120 may include a charge accumulation region 122 in which charges generated by the incident light are accumulated. The charge accumulation regions 122 may be disposed in the substrate 102, and floating diffusion regions 126 may be disposed in frontside surface portions of the substrate 102 to be spaced apart from the charge accumulation regions 122.

The substrate 102 may have a first conductivity type, and the charge accumulation regions 122 and the floating diffusion regions 126 may have a second conductivity type. For example, a p-type substrate may be used as the substrate 102, and n-type impurity diffusion regions functioning as the charge accumulation regions 122 and the floating diffusion regions 126 may be formed in the p-type substrate 102.

Transfer gate structures 110 may be disposed on channel regions between the charge accumulation regions 122 and the floating diffusion regions 126 to transfer the charges accumulated in the charge accumulation regions 122 to the floating diffusion regions 126. Each of the transfer gate structures 110 may include a gate insulating layer 112 disposed on the frontside surface 102A of the substrate 102, a gate electrode 114 disposed on the gate insulating layer 112, and gate spacers 116 disposed on side surfaces of the gate electrode 114. Further, though not shown in FIG. 1, the backside illuminated image sensor 100 may include reset transistors, source follower transistors, and select transistors electrically connected with the floating diffusion regions 126, in ways that will be understood to those of ordinary skill in the art.

If the backside illuminated image sensor 100 is a 3T (or fewer than three transistors) layout, the transfer gate structures 110 may be used as reset gate structures and the floating diffusion regions 126 may be used as active regions for connecting the charge accumulation regions 122 with reset circuitries.

Each of the pixel regions 120 may include a frontside pinning layer 124 disposed between the frontside surface 102A of the substrate 102 and the charge accumulation region 122. Further, each of the pixel regions 120 may include a backside pinning layer 128 disposed between the backside surface 102B of the substrate 102 and the charge accumulation region 122. The frontside and backside pinning layers 124 and 128 may have the first conductivity type. For example, p-type impurity diffusion regions may be used as the frontside and backside pinning layers 124 and 128.

A first wiring layer 134 may be disposed on the insulating layer 130 and may be electrically connected with the pixel regions 120. The first wiring layer 134 may be made of the same material as the bonding pad 132.

Further, a second insulating layer 140 may be disposed on a frontside surface of the insulating layer 130, the bonding pad 132 and the first wiring layer 134, and a second wiring layer 142 may be disposed on the second insulating layer 140. A third insulating layer 144 may be disposed on the second insulating layer 140 and the second wiring layer 142, and a third wiring layer 146 may be disposed on the third insulating layer 144. A passivation layer 148 may be disposed on the third insulating layer 144 and the third wiring layer 146.

Figure 2:
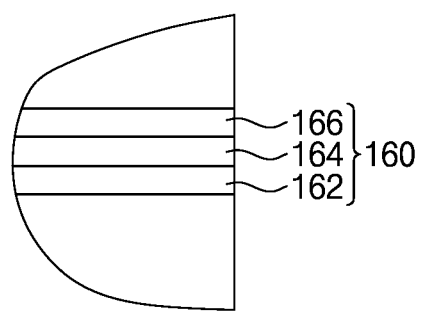
FIG. 2 is an enlarged cross-sectional view illustrating an anti-reflective layer as shown in FIG. 1.

FIG. 2 is an enlarged cross-sectional view illustrating an anti-reflective layer as shown in FIG. 1.

Referring to FIG. 2, the anti-reflective layer 160 may include a metal oxide layer 162 disposed on the backside surface 102B of the substrate 102, a silicon oxide layer 164 disposed on the metal oxide layer 162, and a silicon nitride layer 166 disposed on the silicon oxide layer 164.

The metal oxide layer 162 may function as a fixed charge layer. For example, the metal oxide layer 162 may function as a negative fixed charge layer and include hafnium oxide ($HfO_2$), hafnium oxynitride (HfON), aluminum oxide ($Al_2O_3$), aluminum oxynitride (AlON), hafnium aluminum oxide (HfAlO) or hafnium aluminum oxynitride (HfAlON). In such case, negative charges of the negative fixed charge layer may form a negatively charged shallow minority carrier rich region, i.e., a hole accumulation region, in a backside surface portion of the substrate 102, and the hole accumulation region may improve the function of the backside pinning layers 128 (FIG. 1).

Referring again to FIG. 1, when the charge accumulation region 122 has the first conductivity type, that is, an n-type substrate is used as the substrate 102 and the charge accumulation region 122 include p-type impurities, the metal oxide layer 162 may function as a positive fixed charge layer and include zirconium oxide ($ZrO_2$), hafnium silicon oxide ($HfSiO_2$), hafnium silicon oxynitride (HfSiON) or silicon nitride ($Si_3N_4$). In such case, the positive fixed charge layer may form an electron accumulation region in a backside surface portion of the substrate 102.

Referring still to FIG. 1, the substrate 102 may be protected by the anti-reflective layer 160. In particular, the inner side surface and the bottom surface of the recess 150 may be protected by the first portion 160A and the second portion 160B of the anti-reflective layer 160, and the inner side surface of the second opening 170 may be protected by the first spacer 178. Further, the first spacer 178 may be disposed on the inner side surfaces of the first, second and third openings 168, 170 and 172, and thus the metal oxide layer 162 of the anti-reflective layer 160 may be electrically isolated from the second bonding pad 186 by the first spacer 178. For example, the first spacer 178 and the second spacer 180 may be made of silicon oxide.

A solder bump 200 may be formed on the third bonding pad 192. Alternatively, a wire (not shown) may be bonded on the third bonding pad 192. Further, the solder bump 200 may be disposed on a portion of the third bonding pad 192 disposed in the recess 150 as shown in FIG. 1. Alternatively, the solder bump 200 may be disposed in the first, second and third openings 168, 170 and 172.

FIGS. 3 to 15 are cross-sectional views illustrating a method of manufacturing the backside illuminated image sensor as shown in FIG. 1.

Figure 3:
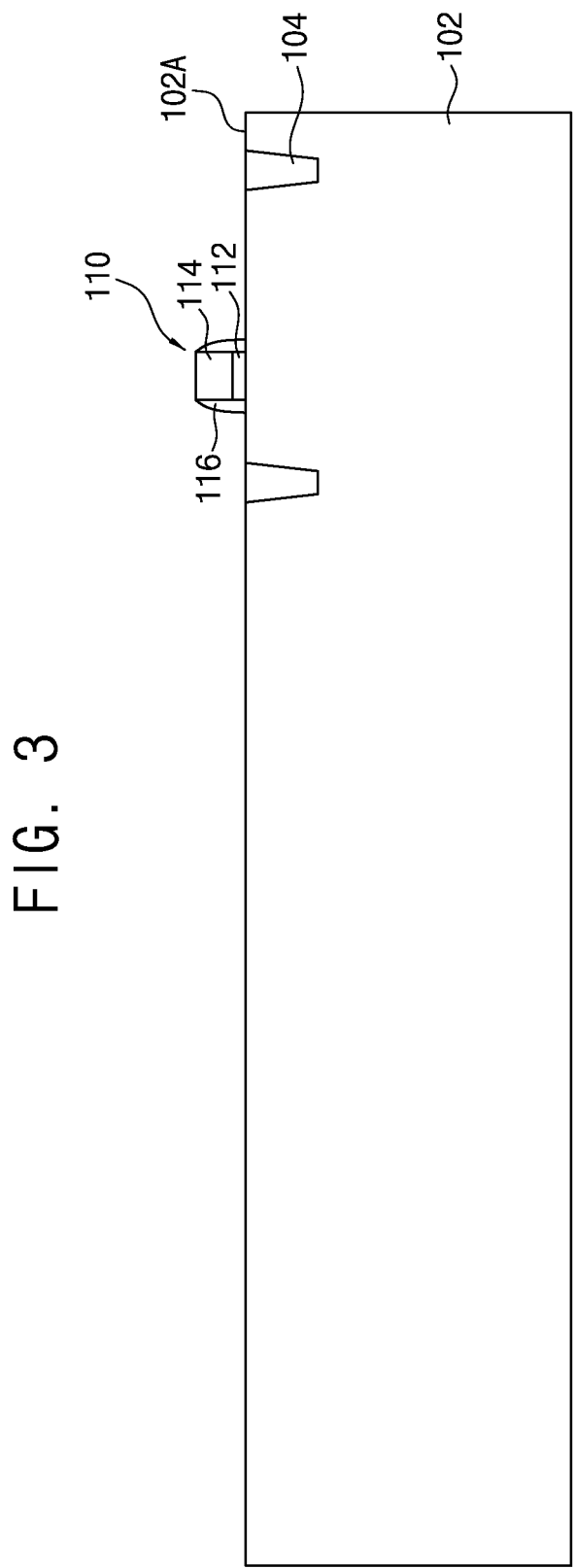
FIGS. 3 to 15 are cross-sectional views illustrating a method of manufacturing the backside illuminated image sensor as shown in FIG. 1.

Referring to FIG. 3, device isolation regions 104 may be formed in frontside surface portions of a substrate 102 to define active regions of the backside illuminated image sensor 100. The substrate 102 may have a first conductivity type. For example, a p-type substrate may be used as the substrate 102. Alternatively, the substrate 102 may include a bulk silicon substrate and a p-type epitaxial layer formed on the bulk silicon substrate. The device isolation regions 104 may be made of silicon oxide and may be formed by a shallow trench isolation (STI) process.

After forming the device isolation regions 104, transfer gate structures 110 may be formed on a frontside surface 102A of the substrate 102. Each of the transfer gate structures 110 may include a gate insulating layer 112, a gate electrode 114 formed on the gate insulating layer 112 and gate spacers 116 formed on side surfaces of the gate electrode 114. Further, though not shown in figures, reset gate structures, source follower gate structures and select gate structures may be simultaneously formed with the transfer gate structures 110 on the frontside surface 102A of the substrate 102, in ways that will be understood to those having ordinary skill in the art.

Figure 4:
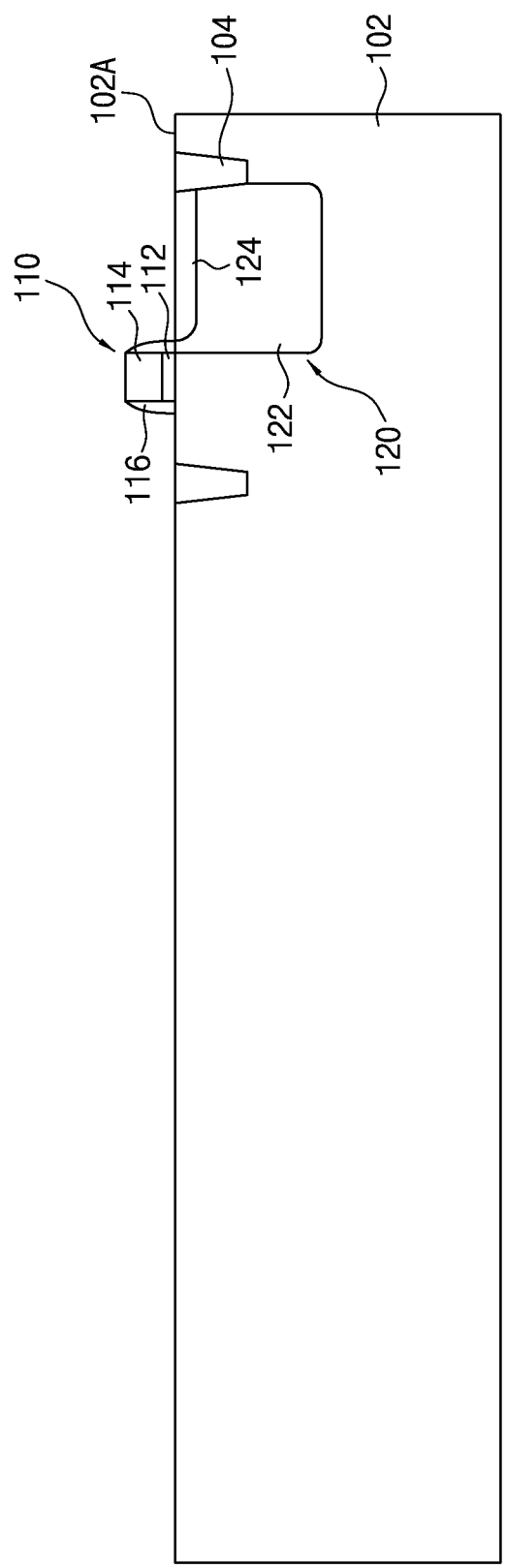

Referring to FIG. 4, charge accumulation regions 122 used as pixel regions 120 may be formed in the substrate 102. In detail, charge accumulation regions 122 having a second conductivity type may be formed in the active regions of the substrate 102. For example, n-type charge accumulation regions 122 may be formed in the p-type substrate 102. The n-type charge accumulation regions 122 may be n-type impurity diffusion regions formed by an ion implantation process.

Then, frontside pinning layers 124 having the first conductivity type may be formed between the frontside surface 102A of the substrate 102 and the charge accumulation regions 122. For example, p-type frontside pinning layers 124 may be formed between the frontside surface 102A of the substrate 102 and the n-type charge accumulation regions 122 by an ion implantation process. The p-type frontside pinning layers 124 may be p-type impurity diffusion regions. The n-type charge accumulation regions 122 and the p-type frontside pinning layers 124 may be activated by a subsequent rapid heat treatment process.

Figure 5:
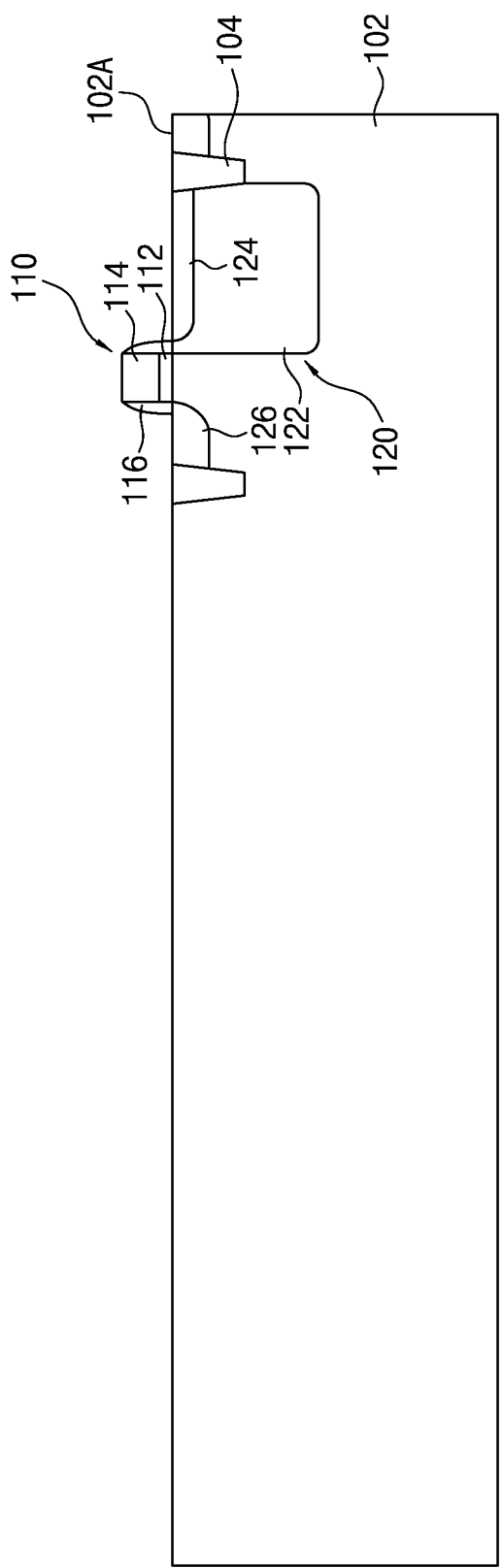

Referring to FIG. 5, floating diffusion regions 126 having the second conductivity type may be formed in frontside surface portions of the substrate 102 to be spaced apart from the charge accumulation regions 122. For example, the floating diffusion regions 126 may be n-type high concentration impurity regions, which may be formed by an ion implantation process. The transfer gate structures 110 may be arranged on channel regions between the charge accumulation regions 122 and the floating diffusion regions 126.

Figure 6:
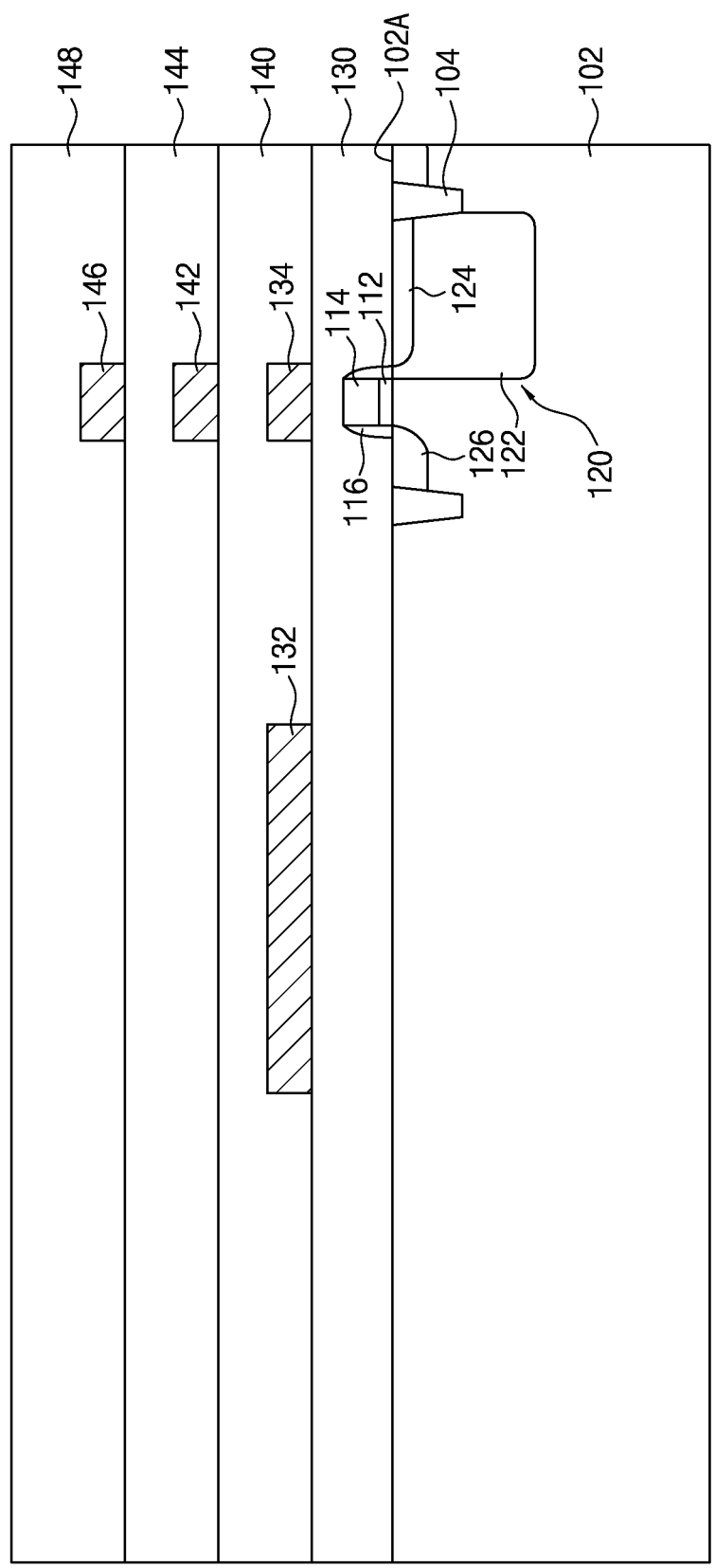

Referring to FIG. 6, an insulating layer 130 may be formed on the frontside surface 102A of the substrate 102, and a bonding pad 132 and a first wiring layer 134 may be formed on the insulating layer 130. The insulating layer 130 may be made of an insulating material such as silicon oxide, and the bonding pad 132 and the first wiring layer 134 may be made of a metallic material such as copper or aluminum. For example, after forming the insulating layer 130, a metal layer (not shown) may be formed on the insulating layer 130, and the bonding pad 132 and the first wiring layer 134 may then be formed by patterning the metal layer.

A second insulating layer 140 may be formed on the insulating layer 130, the bonding pad 132 and the first wiring layer 134, and a second wiring layer 142 may be formed on the second insulating layer 140. A third insulating layer 144 may be formed on the second insulating layer 140 and the second wiring layer 142, and a third wiring layer 146 may be formed on the third insulating layer 144. A passivation layer 148 may be formed on the third insulating layer 144 and the third wiring layer 146. The first, second and third wiring layers 134, 142 and 146 may be electrically connected with the pixel regions 120, and the bonding pad 132 may be electrically connected with the first, second and third wiring layers 134, 142 and 146.

Figure 7:
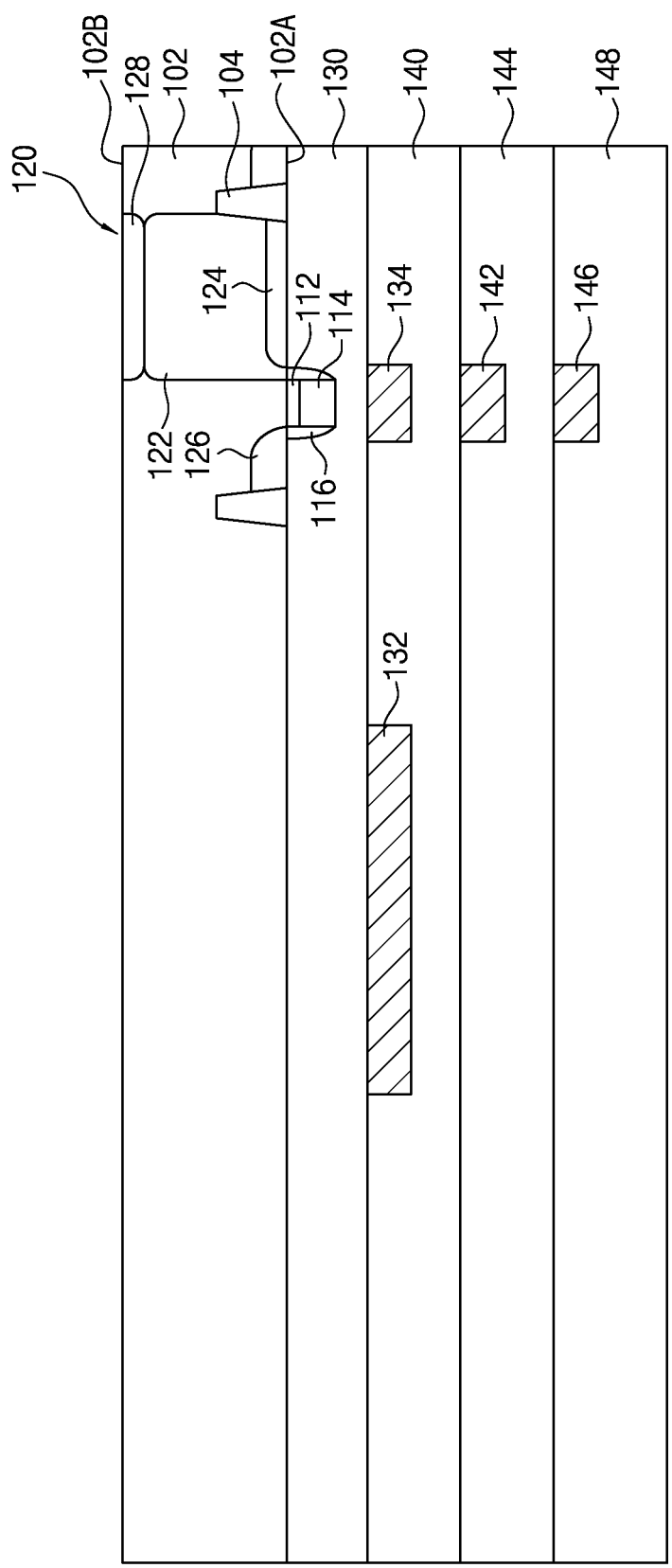

Referring to FIG. 7, a back-grinding process or a chemical and mechanical polishing process may be performed in order to reduce a thickness of the substrate 102. Further, backside pinning layers 128 having the first conductivity type may be formed between a backside surface 102B of the substrate 102 and the charge accumulation regions 122. For example, p-type impurity regions functioning as the backside pinning layers 128 may be formed by an ion implantation process, and may then be activated by a subsequent laser annealing process.

Alternatively, the backside pinning layers 128 may be formed prior to the charge accumulation regions 122. For example, after forming the backside pinning layers 128, the charge accumulation regions 122 may be formed on the backside pinning layers 128, and the frontside pinning layers 124 may then be formed on the charge accumulation regions 122. In such case, the backside pinning layers 128 may be activated by the rapid heat treatment process along with the charge accumulation regions 122 and the frontside pinning layers 124. Further, the back-grinding process may be performed such that the backside pinning layers 128 are exposed.

Meanwhile, when the substrate 102 includes a bulk silicon substrate and a p-type epitaxial layer formed on the bulk silicon substrate, the charge accumulation regions 122 and the frontside and backside pinning layers 124 and 128 may be formed in the p-type epitaxial layer, and the bulk silicon substrate may be removed by the back-grinding process.

Figure 8:
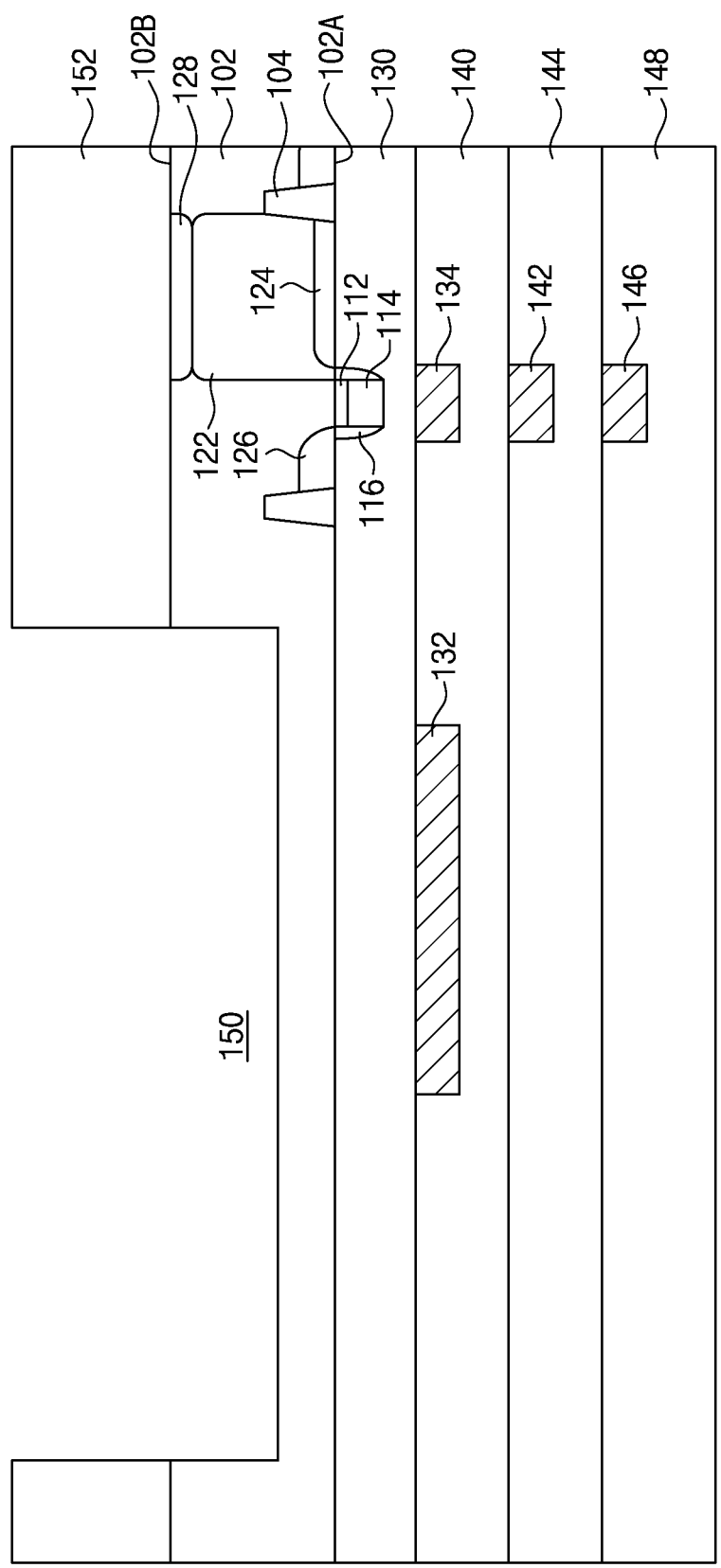

Referring to FIG. 8, the substrate 102 may be partially removed so as to form a recess 150 corresponding to the bonding pad 132 in a backside surface portion of the substrate 102. For example, a first photoresist pattern 152 may be formed on the backside surface 102B of the substrate 102, which exposes a portion of the backside surface 102B of the substrate 102 to correspond to the bonding pad 132. The recess 150 may be formed by an anisotropic etching process using the first photoresist pattern 152 as an etching mask. The recess 150 may have a larger width than the bonding pad 132, and the anisotropic etching process for forming the recess 150 may be performed for a predetermined time so that the recess 150 has a predetermined depth. The first photoresist pattern 152 may be removed by an ashing or stripping process after forming the recess 150.

Figure 9:
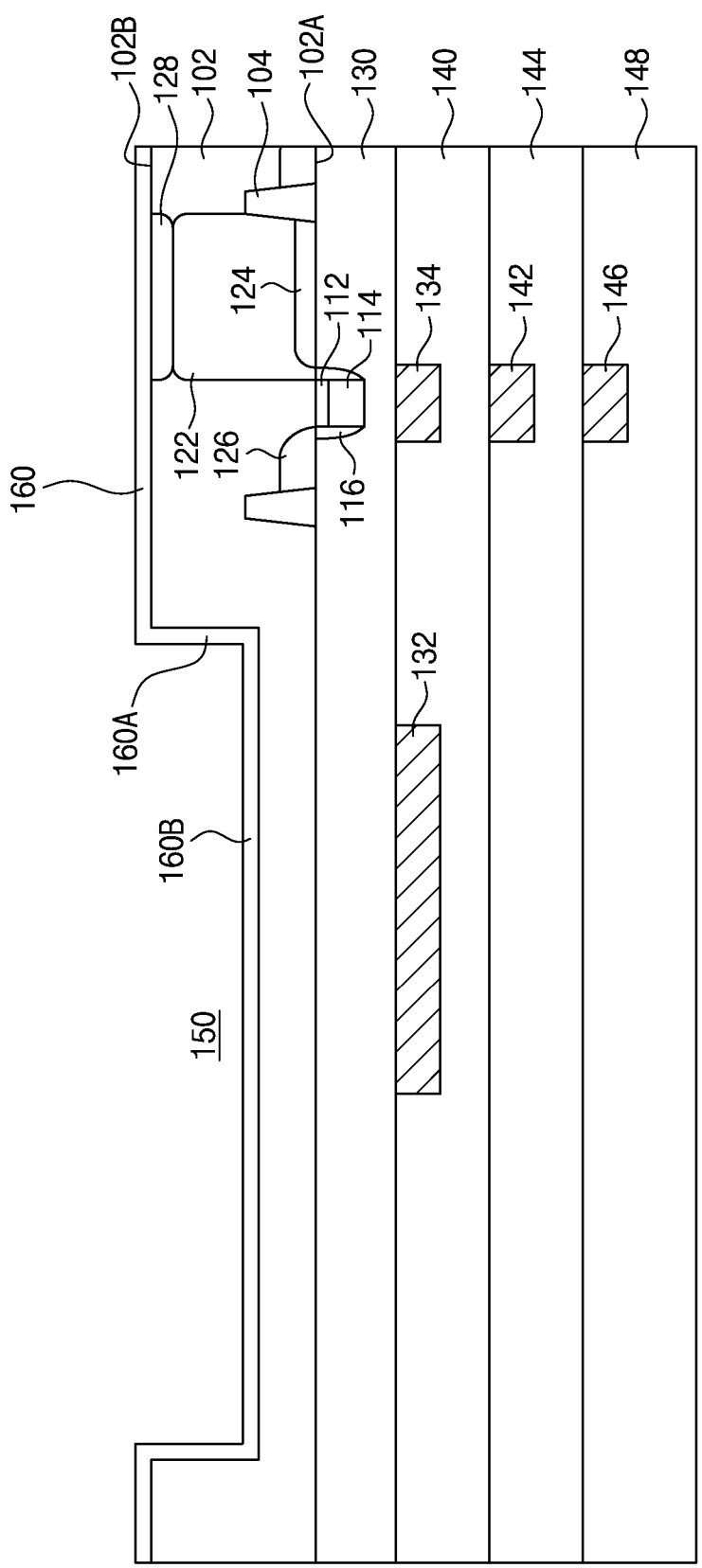

Referring to FIG. 9, an anti-reflective layer 160 may be formed on the backside surface 102B of the substrate 102, and an inner side surface and a bottom surface of the recess 150. Accordingly, the anti-reflective layer 160 may include a first portion 160A formed on the inner side surface of the recess 150 and a second portion 160B formed on the bottom surface of the recess 150. For example, a metal oxide layer 162, a silicon oxide layer 164 and a silicon nitride layer 166 may be sequentially formed on the backside surface 102B of the substrate 102, and the inner side surface and the bottom surface of the recess 150. The metal oxide layer 162 may be formed by a metal organic chemical vapor deposition (MOCVD) process or an atomic layer deposition (ALD) process, and the silicon oxide layer 164 and the silicon nitride layer 166 may be formed by a chemical vapor deposition (CVD) process.

Figure 10:
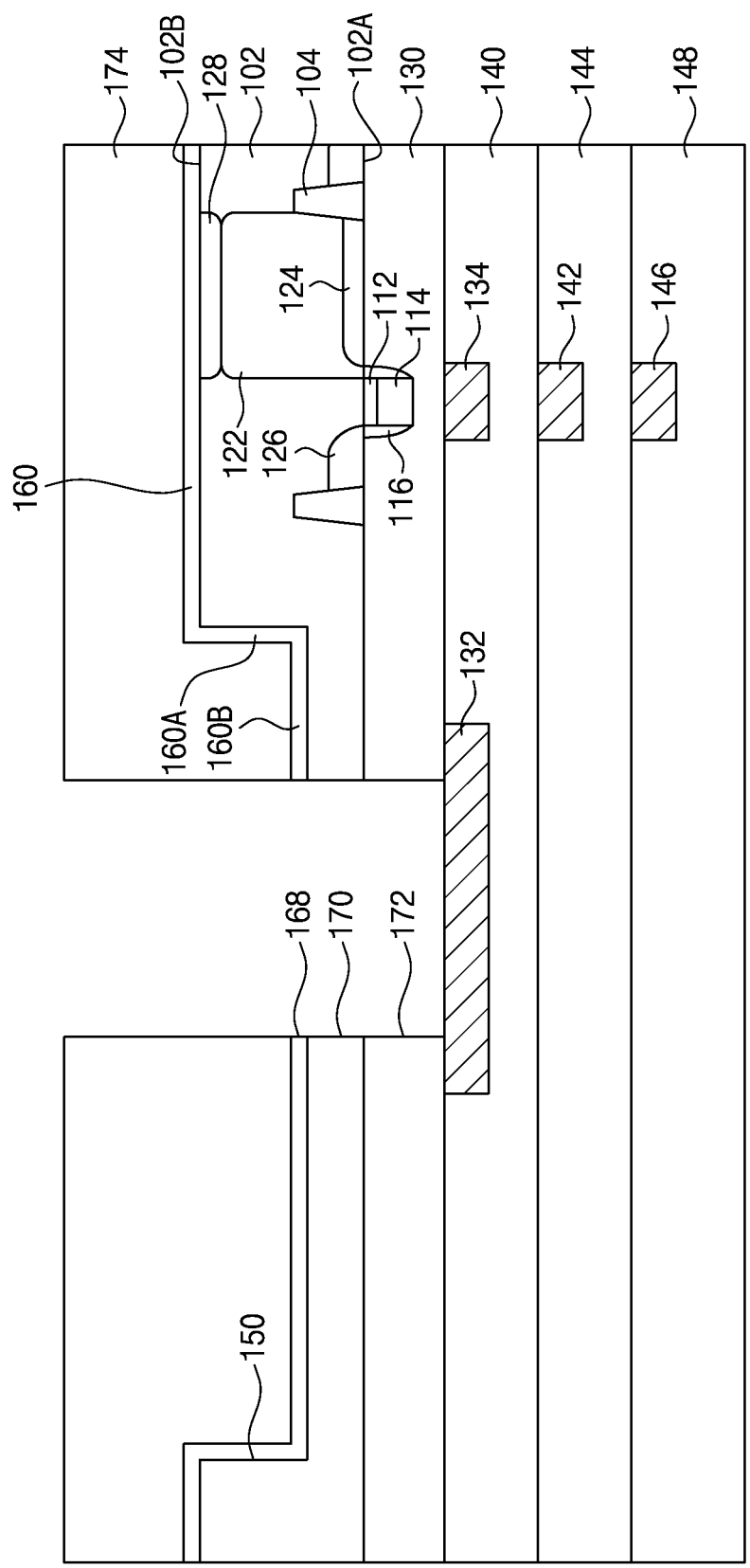

Referring to FIG. 10, the anti-reflective layer 160, the substrate 102 and the insulating layer 130 may be partially removed so as to form a first opening 168, a second opening 170 and a third opening 172 through which partially expose a backside surface of the bonding pad 132. For example, a second photoresist pattern 174 may be formed on the anti-reflective layer 160, which partially exposes the second portion 160B of the anti-reflective layer 160. The first opening 168, the second opening 170 and the third opening 172 may be formed by an anisotropic etching process using the second photoresist pattern 174 as an etching mask. The second photoresist pattern 174 may be removed by an ashing or stripping process after forming the first opening 168, the second opening 170 and the third opening 172.

Figure 11:
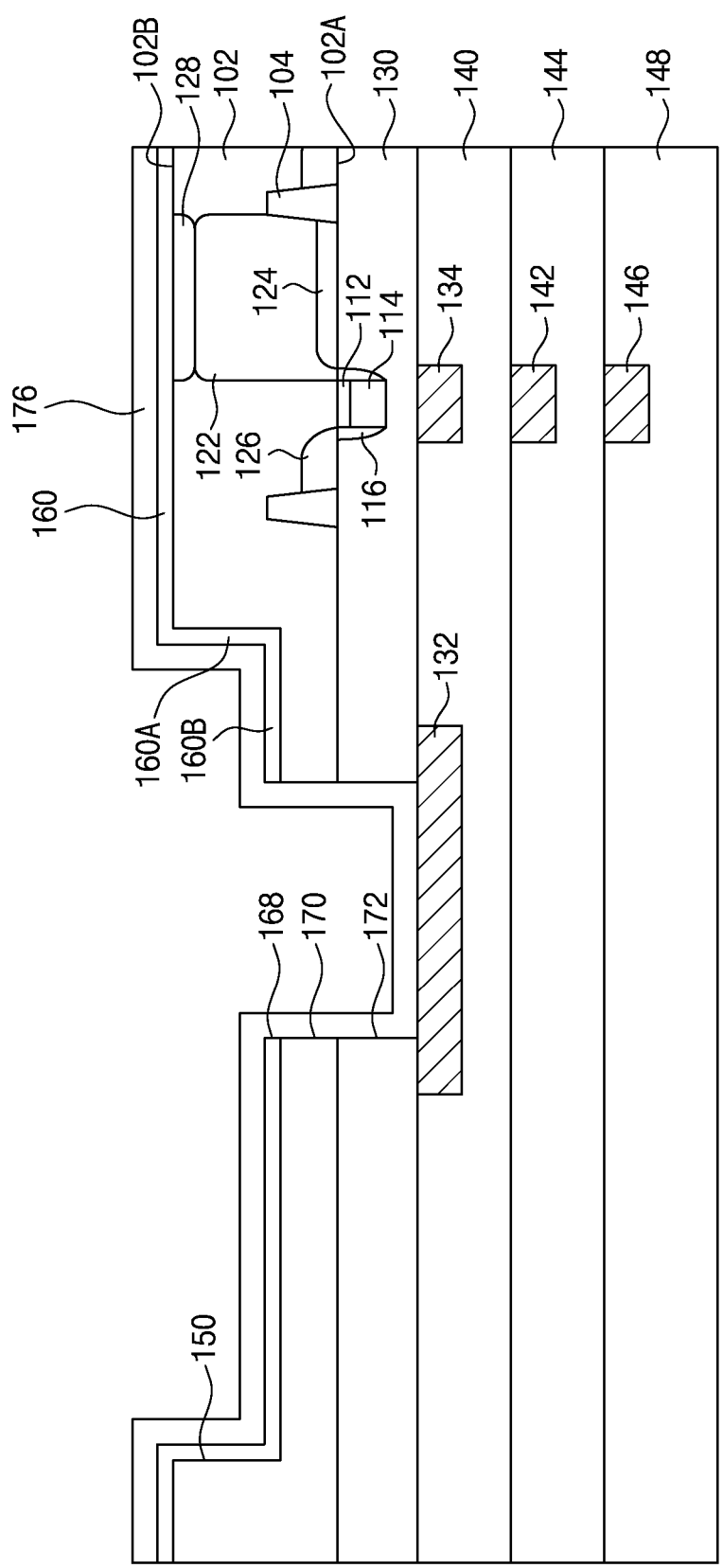

Referring to FIG. 11, a spacer layer 176 may be formed to have a uniform thickness on the anti-reflective layer 160, inner side surfaces of the first, second and third openings 168, 170 and 172, and a portion of the backside surface of the bonding pad 132 exposed by the first, second and third openings 168, 170 and 172. For example, the spacer layer 176 may include silicon oxide and may be formed by a CVD process.

Figure 12:
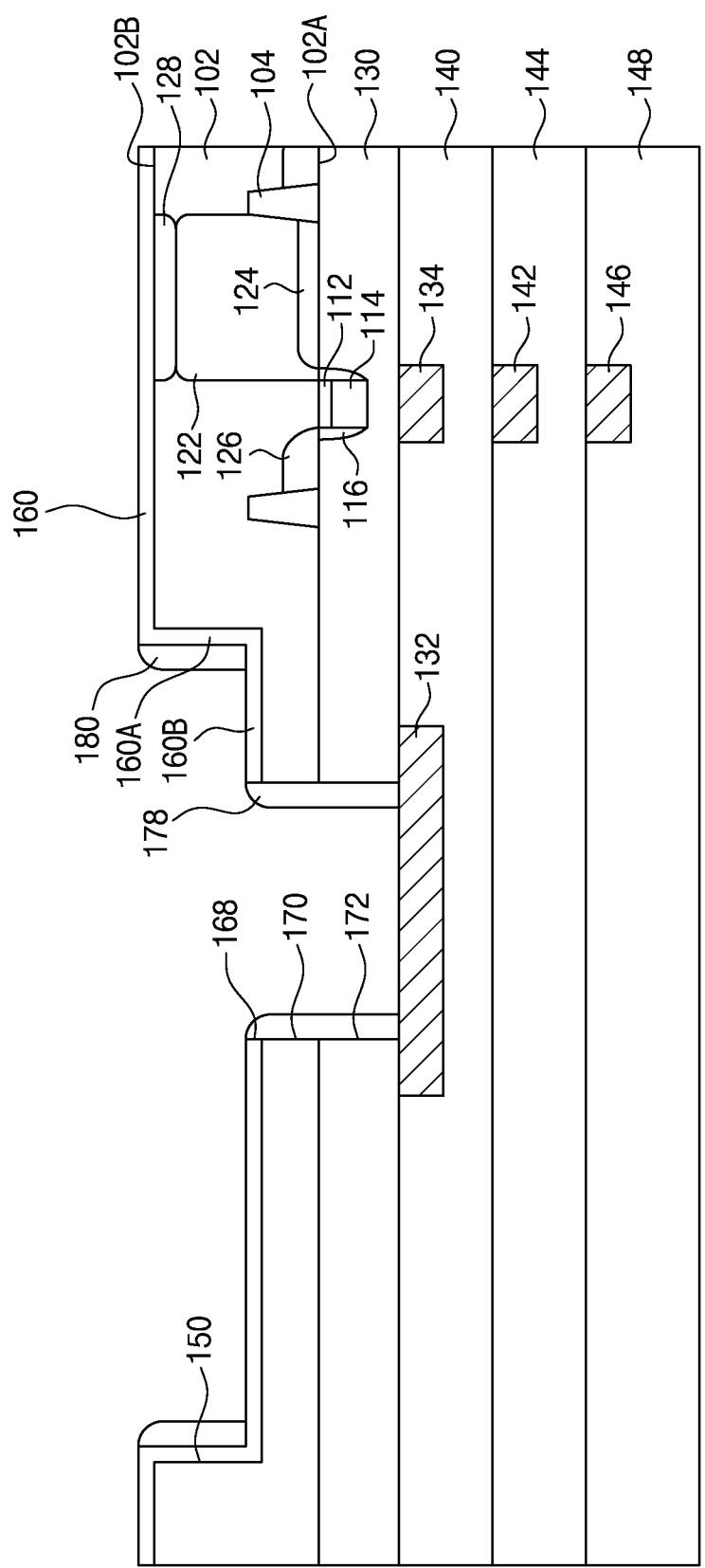

Referring to FIG. 12, the spacer layer 176 may be partially removed to form a first spacer 178 and a second spacer 180. The first spacer 178 may be formed on the inner side surfaces of the first, second and third openings 168, 170 and 172, and the second spacer 180 may be formed on the first portion 160A of the anti-reflective layer 160. For example, the spacer layer 176 may be partially removed by an anisotropic etching process. Particularly, a portion of the spacer layer 176 disposed on the backside surface 102B of the substrate 102 may be fully removed while forming the first and second spacers 178 and 180.

Figure 13:
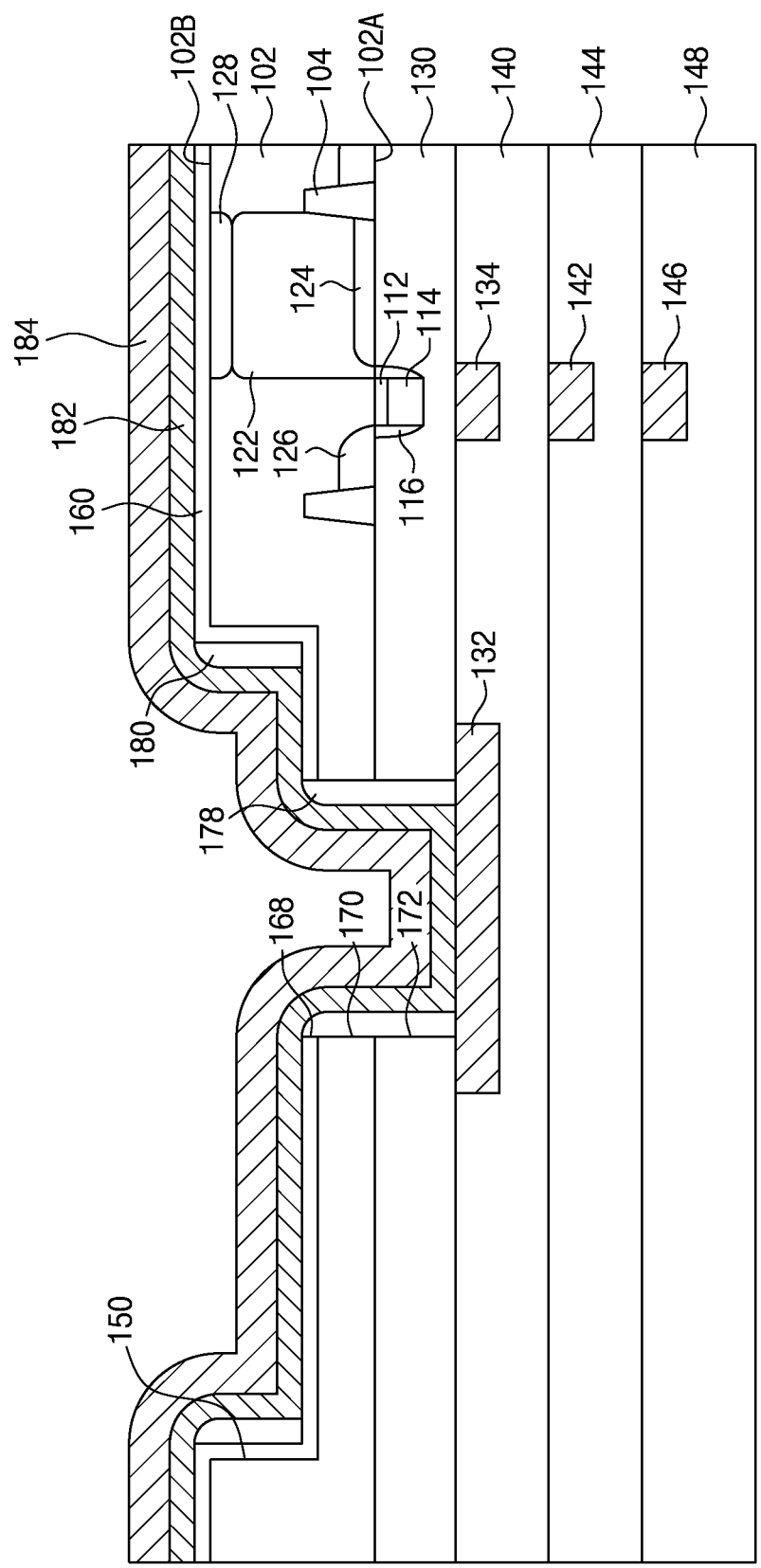

Referring to FIG. 13, a first metal layer 182, e.g., a tungsten layer, may be formed on the anti-reflective layer 160, the first and second spacers 178 and 180, and the portion of the backside surface of the bonding pad 132 exposed by the third opening 172, and a second metal layer 184, e.g., an aluminum layer, may be formed on the first metal layer 182. Particularly, a sum of a thickness of the first metal layer 182 and a thickness of the second metal layer 184 may be smaller than a depth of the recess 150.

Figure 14:
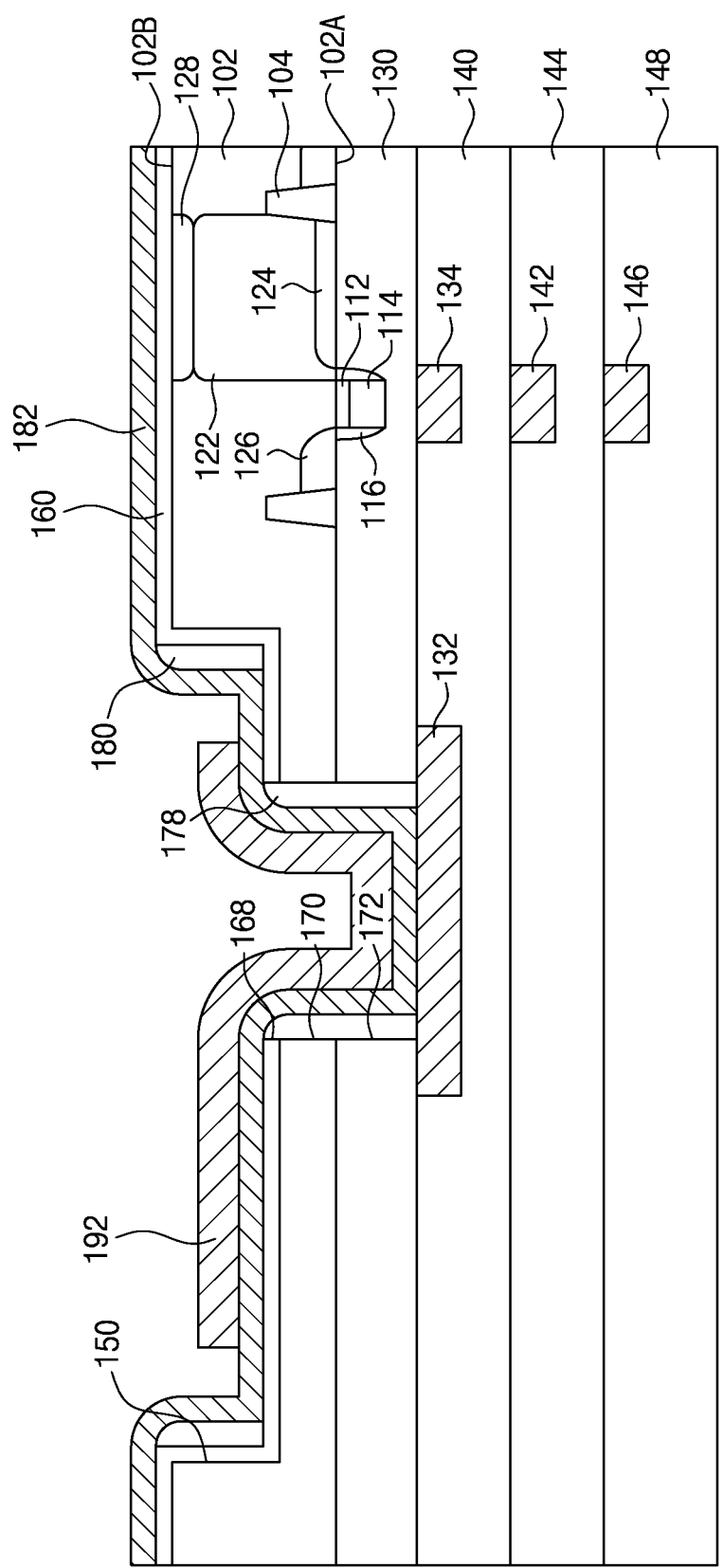

Referring to FIG. 14, a third bonding pad 192 may be formed by patterning the second metal layer 184 as shown in FIG. 14. For example, a third photoresist pattern (not shown) may be formed on the second metal layer 184, and the third bonding pad 192 may be formed by an anisotropic etching process using the third photoresist pattern as an etching mask.

Figure 15:
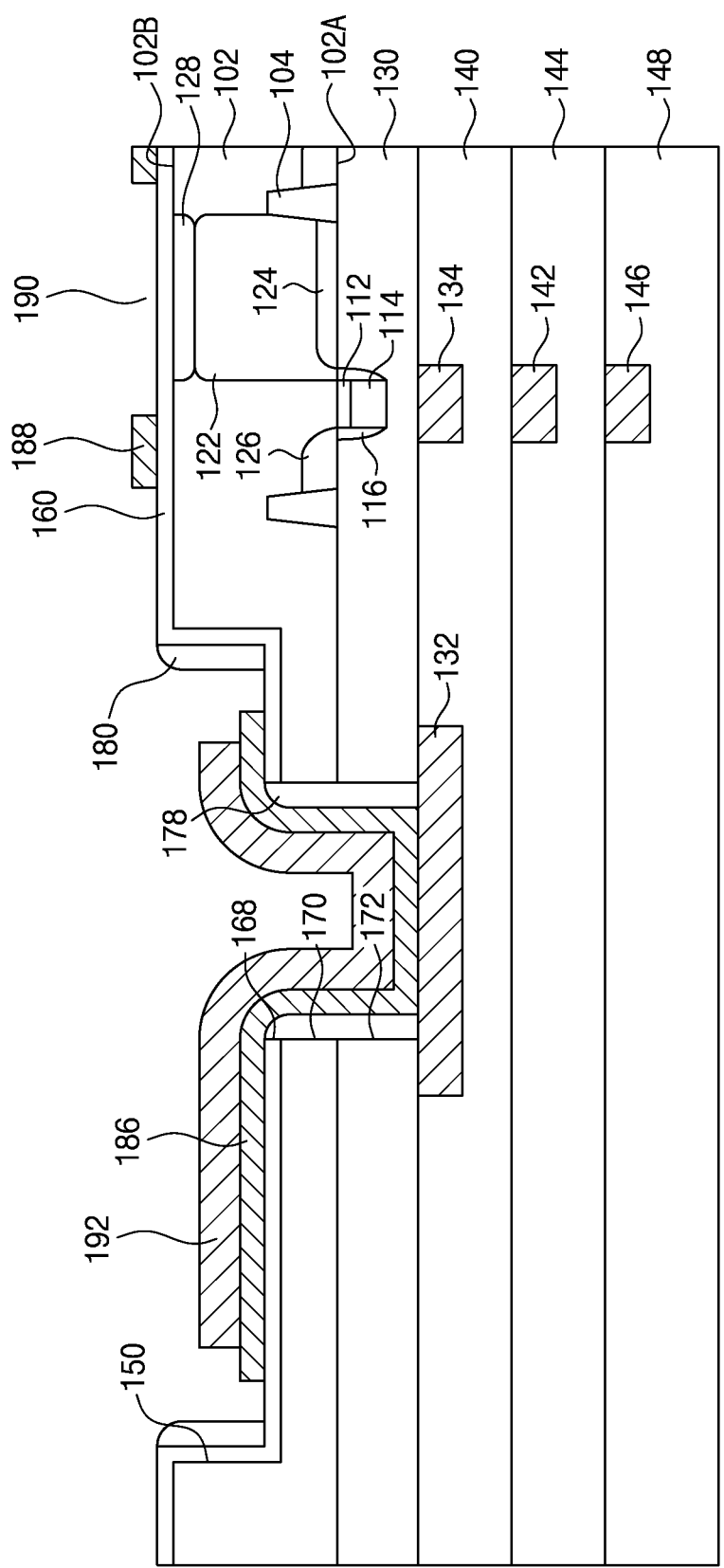

Referring to FIG. 15, a second bonding pad 186 and the light-blocking pattern 188 may be formed by patterning the first metal layer 182. Particularly, the second and third bonding pads 186 and 192 may be arranged in the recess 150. Specifically, the second bonding pad 186 may be formed on the backside surface portion of the bonding pad 132, the first spacer 178 and the second portion 160B of the anti-reflective layer 160, and the third bonding pad 192 may be formed of the second bonding pad 186. The light-blocking pattern 188 may be formed on the anti-reflective layer 160 and may have fourth openings 190 corresponding to the charge accumulation regions 122.

For example, a photoresist layer (not shown) may be formed on the first metal layer 182 and the third bonding pad 192, and then a fourth photoresist pattern (not shown) may be formed by a photolithography process. The second bonding pad 186 and the light-blocking pattern 188 may be formed by an anisotropic etching process using the fourth photoresist pattern as an etching mask. Because a top surface of the third bonding pad 192 is positioned lower than that of the anti-reflective layer 160, a thickness of a portion of the fourth photoresist pattern formed on the third bonding pad 192 may be relatively thick. Accordingly, damage to the third bonding pad 192 may be sufficiently prevented while forming the second bonding pad 186 and the light-blocking pattern 188.

Referring again to FIG. 1, a planarization layer 194 may be formed on the anti-reflective layer 160 and the light-blocking pattern 188, and a color filter layer 196 and a micro lens array 198 may be sequentially formed on the planarization layer 194. The planarization layer 194 may be made of an insulating material such as silicon oxide or silicon nitride.

The color filter layer 196 may include red filters, blue filters and green filters. Each of the filters may be formed by forming a color photoresist layer and then performing a photolithography process. Because the top surface of the third bonding pad 192 is positioned lower than that of the planarization layer 194, stripe defects may be prevented from occurring while forming the color photoresist layer.

Although the backside illuminated image sensor and the method of manufacturing the same have been described with reference to specific embodiments, they are not limited thereto. Therefore, it will be readily understood by those skilled in the art that various modifications and changes can be made thereto without departing from the spirit and scope of the present disclosure defined by the appended claims.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A backside illuminated image sensor comprising:
    a substrate having a frontside surface, a backside surface and a recess formed in a portion of the backside surface;
    a plurality of pixel regions disposed in the substrate;
    an insulating layer disposed on the frontside surface of the substrate, the insulating layer defining a frontside surface;
    a bonding pad disposed on the frontside surface of the insulating layer; and
    an anti-reflective layer disposed on the backside surface of the substrate and comprising a first portion disposed on an inner side surface of the recess and a second portion disposed on a bottom surface of the recess;
    a second bonding pad disposed on the second portion of the anti-reflective layer in the recess and electrically connected with the bonding pad,
    wherein the anti-reflective layer, the substrate and the insulating layer include a first opening, a second opening and a third opening for exposing a portion of a backside surface of the bonding pad, respectively,
    the second bonding pad is electrically connected with the bonding pad through the first opening, the second opening and the third opening, and
    a first spacer is disposed on inner side surfaces of the first, second and third openings.

2. The backside illuminated image sensor of claim 1, wherein a second spacer is disposed on the first portion of the anti-reflective layer.

3. The backside illuminated image sensor of claim 1, further comprising a third bonding pad disposed on the second bonding pad,
    wherein a sum of a thickness of the second bonding pad and a thickness of the third bonding pad is smaller than a depth of the recess.

4. The backside illuminated image sensor of claim 1, further comprising a light-blocking pattern disposed on the anti-reflective layer and having fourth openings corresponding to the pixel regions.

5. The backside illuminated image sensor of claim 4, wherein the second bonding pad is made of the same material as the light-blocking pattern.

6. The backside illuminated image sensor of claim 1, wherein the anti-reflective layer comprises:
    a metal oxide layer disposed on the backside surface of the substrate;
    a silicon oxide layer disposed on the metal oxide layer; and
    a silicon nitride layer disposed on the silicon oxide layer.

* * * * *